United States Patent [19]

Kuwana

[11] Patent Number: 5,138,197

[45] Date of Patent: Aug. 11, 1992

[54] ADDRESS DECODER ARRAY COMPOSED OF CMOS

[75] Inventor: Kiyohisa Kuwana, Yokohama, Japan

[73] Assignee: Kabushiki Kaisha Toshiba, Kawasaki, Japan

[21] Appl. No.: 704,215

[22] Filed: May 22, 1991

[30] Foreign Application Priority Data

May 23, 1990 [JP] Japan .................................. 2-131428

[51] Int. Cl.⁵ ........................ H03K 19/20; H01L 25/00
[52] U.S. Cl. ................................. 307/449; 307/303.2; 357/42; 357/45
[58] Field of Search .................... 365/230.06; 307/449, 307/463, 468, 469, 465.1, 303.1, 303.2; 357/51, 42, 45, 71

[56] References Cited

U.S. PATENT DOCUMENTS

| | | | |
|---|---|---|---|
| 4,949,157 | 8/1990 | Minami | 357/45 |
| 4,965,651 | 10/1990 | Wagner | 357/45 |
| 4,992,845 | 2/1991 | Arakawa et al. | 357/42 |

Primary Examiner—David Hudspeth
Assistant Examiner—Andrew Sanders
Attorney, Agent, or Firm—Finnegan, Henderson, Farabow, Garrett and Dunner

[57] ABSTRACT

A NAND-system address decoder is configured by arranging the P-channel- and N-channel logical blocks in parallel and input wires to which address signals are supplied is extendedy formed in the direction in which the above logical blocks are arranged. And, output lines extended from each logical block are connected to a output portion in parallel. The P-channel- and N-channel logical circuits are configured by collection of local decode circuits. The local decode circuit is composed of a P-channel MISFET circuit consisting of parallely-connected P-channel MISFETs corresponding to the number of address-signal bits and a N-channel MISFET circuit consisting of serially-connected N-channel MISFETs corresponding to the number of address-signal bits. The MISFET configuring each MISFET circuits are configured so that a gate will be set at the position to which the above input wires will extend.

8 Claims, 5 Drawing Sheets

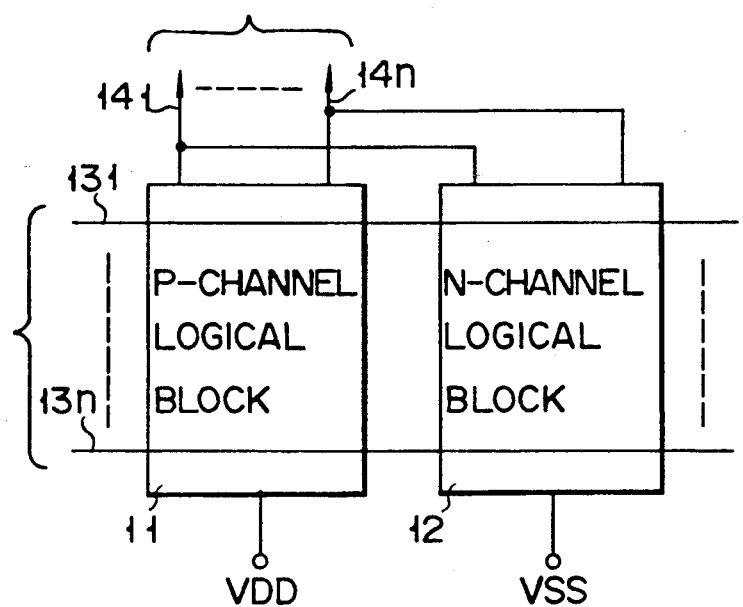
F I G. 1
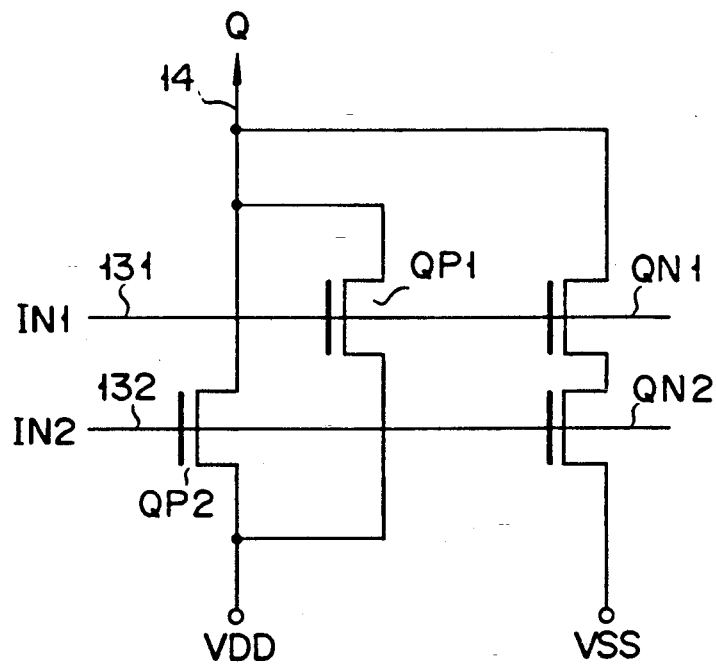
F I G. 2

ADDRESS DECODER ARRAY COMPOSED OF CMOS

BACKGROUND OF THE INVENTION

1. Field of the Invention

The present invention relates to an NAND-circuit-type address decoder apparatus for decoding address signals, more particularly to an address decoder apparatus composed of CMOS using P- and N-channel MISFETs.

2. Description of the Related Art

An address decode circuit for use in semiconductor memories comprises a P-channel logical block including P-channel enhancement-type MISFETs and a N-channel logical block including N-channel enhancement-type MISFETs.

FIG. 6 shows the configuration of an existing address decoder having the P-channel logical block 51 and N-channel logical block 52. In this decoder the power-supply voltage $V_{DD}$ of positive polarity is applied to the P-channel logical block 51, and the reference voltage $V_{SS}$ of 0 volt is applied to the N-channel-logical block 52. Address signals AO-An are supplied to the logical blocks 51 and 52 through input wires 53 in parallel. The address signals are supplied to the gates of MISFETs of the P-channel logical block 51 and the N-channel logical block 52.

The output wires extending from the P-channel-side logical block 51 and the N-channel-side logical block 52 are arranged in the wiring space between the logical blocks 51 and 52, and are connected with output wires 54 in this space.

The address decoder, thus configured, is a so-called NAND circuit system, in which P-channel MISFET circuits formed by connecting P-channel MISFETs in parallel are installed in the P-channel logical block 51, and N-channel MISFET circuits formed by connecting N-channel MISFETs in series are installed in the N-channel logical block 52. A set of local decode circuit is formed of a set of MISFET circuit of the P-channel logical block 51 and a set of MISFET circuit of the N-channel logical block 52. Thus, the address decoder is made by combining local decode circuits.

FIG. 7 shows a one of the local decode circuits constituting the address decoder, to which 2-bit address signals IN1 and IN2 are input.

The P-channel MISFET circuit in the P-channel logical block 51 is composed of two P-channel MISFETs QP1 and QP2 which are connected in parallel between the output node and the point where the supply voltage $V_{DD}$ is input. The N-channel MISFET circuit in the N-channel logical block 52 is composed of two N-channel MISFETs QN1 and QN2 which are connected in series between the output node and the point where the reference voltage $V_{SS}$ is input. The address signal IN1 is supplied to the gates of the P-channel MISFET QP1 and the N-channel MISFET QN1 and the address signal IN2 is supplied to the gates of the P-channel MISFET QP2 and the N-channel MISFET QN2. Output signals are output from the output nodes of P-channel and N-channel MISFET circuits.

FIG. 8 show the address decoder actually mode in the form of an integrated circuit. FIG. 8 illustrates, in particular the elements of the P and N channel logical blocks shown in FIG. 6.

Power-supply voltage wire 61 made of aluminum, to which the supply voltage $V_{DD}$ is set, and the supply voltage wire 62 made of aluminum to which the reference voltage $V_{SS}$ is set, extend parallel and vertically in FIG. 8. P-type diffusion areas 63, 64, and 65, which serve as the source and drain areas of the P-channel MISFETs QP1 and QP2, are formed and connected to the wire 61 to which the supply voltage $V_{DD}$ is set. N-type diffusion areas 66 and 67, which serve as the source and drain areas of the N-channel MISFETs QN1 and QN2, and the N-type diffusion area 68, which serve as a part of the output wire, are formed and provided for the supply voltage wire 62 to which the supply voltage $V_{CC}$ is set. Polycrystal silicon wires 69 and 70 are formed as the gate electrodes of the MISFETs QP1, QP2, QN1, and QN2, to which signal wires 71 and 72 made of aluminum and extending formed parallel to the wires 61 and 62 are connected. The input signals IN1 and IN2 are supplied to the signal wires 71 and 72. Jumper wire 73 made of aluminium connects the P-type diffusion area 64, which serves as the drain area common to the P-channel MISFETs QP1 and QP2, to the N-type diffusion area 68 which serves as the drain area of the N-channel MISFET QN1.

Many local decode circuits, in FIG. 8, are formed on one semiconductor chip. Signal wires for supplying address signals to many local decode circuits should be formed outside the logical blocks. Therefore, a large wire area is necessary for the signal wires. Since the address decoder is a combination of many local decode circuits, the layout of the local decode circuits is complicated in proportion to memory capacity.

To obtain output signals from many local decode circuits, jumper wires must be arranged in the logical blocks. Thus, when the area of each local decode circuit increases, especially when the number of address-signal bits is large because of an increase of memory capacity, the area required for each local decode circuit will increase.

SUMMARY OF THE INVENTION

It is an object of the present invention to provide an address decoder formed of MISFETs capable of decreasing the area required for a chip even if memory capacity increases.

It is another object of the present invention to provide an address decoder which can be made of a chip of a simple configuration, because an output signal circuit is located outside the area where many local decode circuits are arranged, and which requires only a small area for each local decode circuit even if memory capacity increases.

It is still another object of the present invention to provide an address decoder capable of easily configuring a large-capacity memory so that the area required for each local decode circuit will not increase even if the number of address-signal bits increase because of increase of memory capacity.

The address decoder of the present invention has the first logical block composed of first-channel-type MISFETs and the second logical block composed of second-channel-type MISFETs, in which first and second logical blocks are arranged side by side, and input wires are formed to supply address signals to the gates of MISFETs forming the first and second logical blocks. The input wires cross the first and second logical blocks. The address decoder further comprises output wires extending from the first and second logical blocks and connected to one another outside these blocks.

In the address decoder, the input wires corresponding to address-signal bits cross the first and second logical blocks arranged in a plane, side by side. Therefore, it is unnecessary to provided the area for these input wires outside each block, or to increase the chip area for the input wires. Thus, the chip area is far smaller than that of the conventional address decoder, particularly if the memory capacity is large.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram for describing the address decoder configured by using the MISFETs according to one embodiment of the present invention;

FIG. 2 is a circuit diagram showing one of the decode circuits forming the address decoder shown in FIG. 1;

DETAILED DESCRIPTION OF THE PREFERRED EMBODIMENTS

Figure 3:
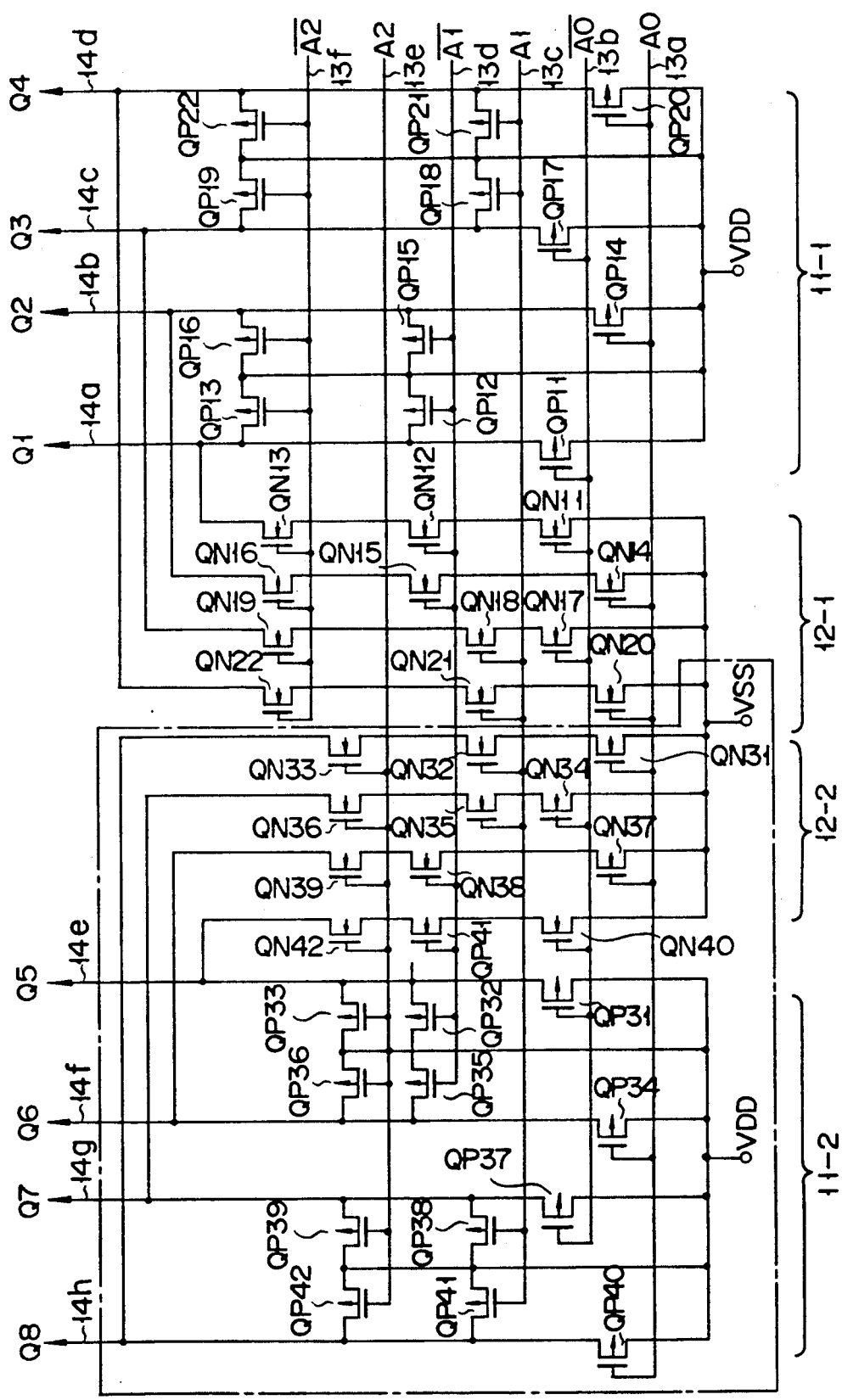
FIG. 3 shows an example of the address decoder shown in FIG. 1, which decodes three-bits address signals.

As is shown in FIG. 1, an address decoder is composed of the P-channel logical block 11 and the N-channel logical block 12 which are arranged in a plane, side by side. The power-supply voltage $V_{DD}$ of positive polarity is applied to the P-channel logical block 11, and a reference voltage $V_{SS}$ of "0" volt is applied to the N-channel logical block 12.

The address decoder is a so-called NAND system, in which the P-channel logical block 11 is composed of P-channel MISFET circuits comprising as many P-channel MISFETs as address-signal bits, which are connected in parallel, and the N-channel logical block 12 is composed of N-channel MISFET circuits comprising as many N-channel MISFETs as address-signal bits, which are connected in series. Each decode circuit is configured by combining one P-channel MISFET circuit of the P-channel logical block 11 with one P-channel MISFET circuit of the N-channel logical block 12. The address decoder, therefore, comprises a plurality of decode circuits.

Address input wires 131-13n, corresponding to the number address-signal bits cross the P-channel logical block 11 and the N-channel logical block 12. The outputs of the logical blocks 11 and 12 are connected to the output wires 141-14m, outside the logical blocks 11 and 12.

FIG. 2 shows one of the decode circuits, each composed of a P-channel MISFET circuit of the P-channel logical block 11 and an N-channel MISFET circuit of the N-channel logical block 12. This decode circuits is designed to decode input signals IN1 and IN2.

The P-channel MISFET circuit has two P-channel enhancement-type MISFETs QP1 and QP2 connected in parallel at their source and drain electrodes. The voltage $V_{DD}$ is applied to the sources of MISFETs QP1 and QP2. The drains of MISFETs QP1 and QP2 are connected to the output wire 14.

The N-channel MISFET circuit has two N-channel enhancement-type MISFETs QN1 and QN2 which are connected in series between the reference voltage $V_{SS}$ and the output wire 14.

An the input wire 131, to which the address signal IN1 is supplied, is connected to the gate electrodes of the P-channel MISFET QP1 and N-channel MISFET QN1. An input wire 132, to which the address signal IN2 is supplied, is connected to the gate electrodes of the P-channel MISFET QP2 and the N-channel MISFET QN2.

Figure 6:
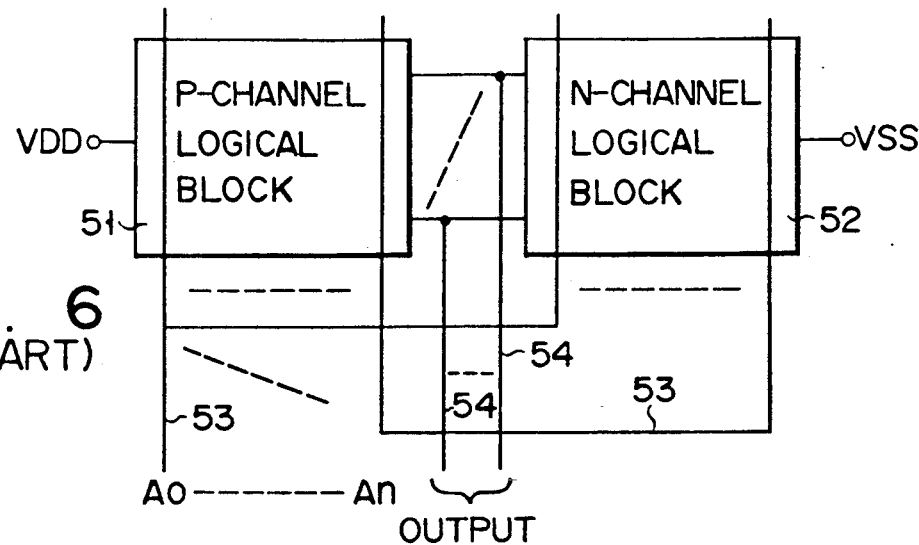
FIG. 6 shows the conventional address decoder.
Figure 7:
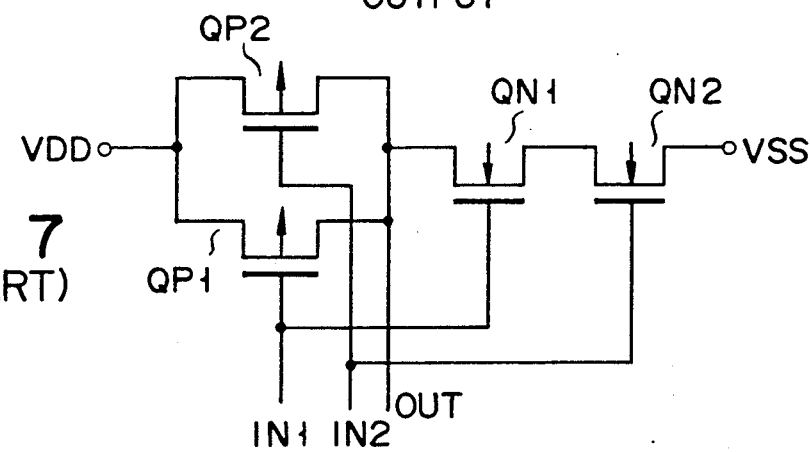
FIG. 7 is a circuit diagram showing one of the decode circuits forming the address decoder shown in FIG. 6.
Figure 8:
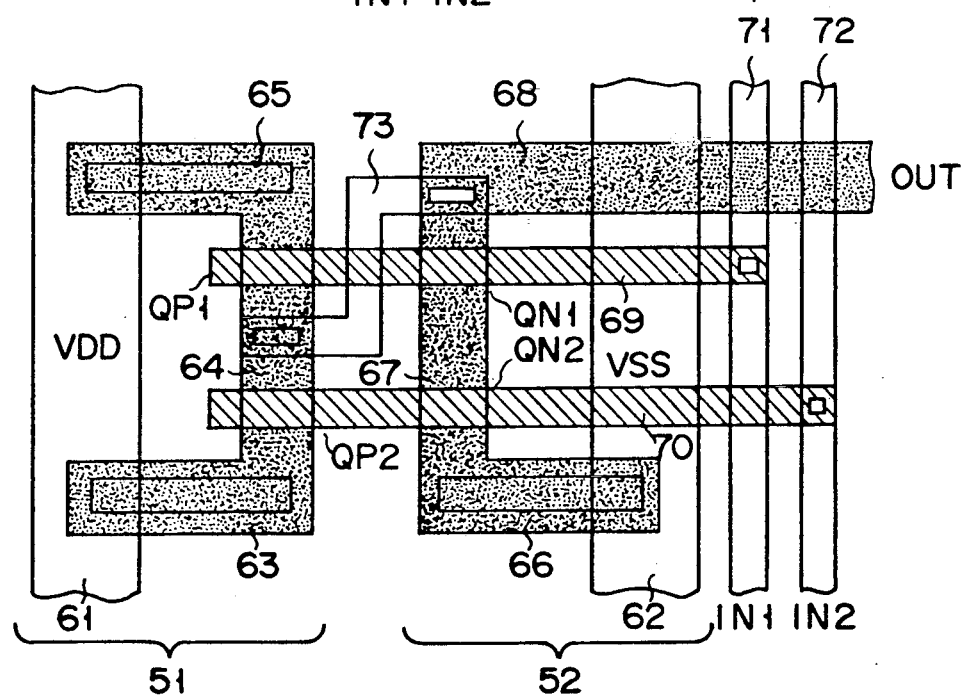
FIG. 8 shows the circuit pattern of the decode circuit shown in FIG. 7.

Since the input wires 131 and 132 cross the P-channel logical block 12 and N-channel logical block 13 which are arranged in a plane, side by side, no large area meads to be provided for address input wires for supplying address signals in each decoder circuit, unlike the prior arts shown in FIGS. 6 to 8.

FIG. 3 shows an address decode composed of decode circuits of the type shown in FIG. 2. Address signals consisting of three bits of A0 ($\overline{A0}$), A1 ($\overline{A1}$), and A2 ($\overline{A2}$) are input to this address decoder.

This address decoder comprises P-channel logical blocks 111 and 112 and N-channel logical blocks 121 and 122. The N-channel logical blocks 121 and 122 are arranged side by side, and the P-channel logical blocks 111 and 112 are arranged at the both sides of them respectively.

The P-channel logical block 111 comprises four groups of P-channel enhancement-type MISFETs, each group consisting of three MISFETs which are connected in parallel and which correspond to the three bits of an input signal, respectively. More specifically, the first group consists of MISFETs QP11 to QP13; the second group consists of MISFETs QP14 to QP16; the third group consists of MISFETs QP17 to QP19; and the fourth group consists of MISFETs QP20 to QP22. These groups of MISFETs are arranged in the first direction perpendicular to the direction in which logical blocks 111, 112, 121, and 122 are arranged respectively and each group of MISFETs is arranged in the second direction perpendicular to the first direction. The source of each group is connected in common by the wire extending in the above first direction and connected to the point to which the voltage $V_{DD}$ is supplied. The drain of each group is connected in common by the wire extending in the first direction and connected to the output wires 14a to 14d to obtain output signals Q1 to Q4 for each group at the opposite side to the point to which the voltage $V_{DD}$ is supplied.

The N-channel logical block 121 is located adjacent to the P-channel logical block 111. The block 121 comprises four groups of N-channel enhancement-type MISFETs, each group consisting of three MISFETs which are connected in series and which correspond to the three bits of an input signal, respectively. More specifically, the first group consists of MISFETs QN11 to QN13 the second group consists of MISFETs QN14 to QN16; the third group consists of MISFETs QN17 to QN19; and the fourth group consists of MISFETs QPN0 to QN22. Each drain of the MISFETs QN13, QN16, QN19, and QN22 which are the closest to the output side in each group is connected to each of the output wires 14a to 14d. Each source of the MISFETs QN11, QN14, QN17, and QN20 of each group set opposite to the output side is connected to the reference voltage $V_{SS}$.

The N-channel block 122 is located near the N-channel logical block 121 and opposes the P-channel logical block 111. The block 122 has a structure similar to that of the block 121. Namely, the block 122 comprises four groups of N-channel enhancement-type MISFETs, each group consisting of three MISFETs which are connected in series, thus forming a series circuit, and which correspond to the three bits of an input signal, respectively. More specifically, the first group consists of MISFETs QN31 to QP33 the second group consists of MISFETs QN34 to QN36; the third group consists of MISFETs QN37 to QN39; and the fourth group consists of MISFETs QN40 to QP42. The drains of the MISFETs QN42, QN39, QN36, and QN33, which are at the output ends of the series circuits, are connected to output wires 14e to 14h, respectively, for providing outputs Q8, Q7, Q6, and Q5. The sources of the MISFETs QN31, QN34, Qn37, and QN40, which are at the input ends of the series circuit, are connected to a reference voltage source $V_{SS}$.

The P-channel logical block 112 opposes the P-channel logical block 111, with the N-channel logical blocks 121 and 122 arranged between the blocks 111 and 112. The block 112 comprises four groups of P-channel enhancement-type MISFETs, each group consisting of three MISFETs which are connected in parallel and which correspond to the three bits of an input signal, respectively. More specifically, the first group consists of MISFETs QP31 to QP33; the second group consists of MISFETs QP34 to QP36; the third group consists of MISFETs QP37 to QP39; and the fourth group consists of MISFETs QP40 to QP42. The four groups of MISFETs are arranged are arranged in the first direction perpendicular to the direction in which the blocks 111, 112, 121, and 122 are arranged. The MISFETs of each group are arranged in the second direction perpendicular to the first direction. The sources of the MISFETs of each group are connected together by wires extending in the first direction, and are connected to the point where the power-supply voltage $V_{DD}$ is applied. The drains of the MISFETS of each group are connected by wires extending in the first direction, to the output lines 14e to 14h, respectively, for providing outputs Q5 to Q8. The output lines 14e to 14h are spaced apart from the point where the voltage $V_{DD}$ is applied.

The address decoder circuit has six bit-input wires 13a to 13f corresponding to three-bit address signal. They extend in the second direction, crossing the logical blocks 111, 121, 122, and 112.

The address signal A0 to be supplied to the input wire 13a is supplied to the gates of the P-channel MISFETs QP20, QP14, QP34 and QP40, and those of the N-channel MISFETs QN14, QN20, QN31 and QN37. The signal $\overline{A0}$, made by inverting the address signal A0, and to be supplies to the input wire 13b, is supplied to the gates of the P-channel MISFETs QP17, QP11, QP31 and QP37, and those of the N-channel MISFETs QN11, QN17, QN34 and QN40.

The address signal A1 to be supplied to the input wire 13c is supplied to the gate of the P-channel MISFETs QP21, QP18, QP38 and QP41, and those of the N-channel MISFETs QN18, QN21, QN32 and QN35. The signal $\overline{A1}$, made by inverting the address signal A1 and to be supplied to the input wire 13d, is supplied to the gates of the P-channel MISFETs QP15, QP12, QP32 and QP35, and those of the N-channel MISFETs QN12, QN15, QN38 and QN41.

The address signal A2 to be supplied to the input wire 13e is supplied to the gates of the P-channel MISFETs QP33, QP36, QP39 and QP42, and those of the N-channel MISFETs QN33, QN36, QN39 and QN42 of the logical blocks 112 and 122. The signal $\overline{A2}$, made by inverting the address signal A2 to be supplied to the input wire 13f, is supplied to the gates of the P-channel MISFETs QP22, QP19, QP16 and QP13, and those of the N-channel MISFETs QN13, QN16, QN19 and QN22 of the logical blocks 111 and 121.

In the address decode circuit, thus configured, if the address signals A0, A1, A2 are all at "1", the signal levels of the input wires 13a, 13c, and 13e are set to "1", and the signal levels of the input wires 13b, 13d, and 13f are set to "0". In this case, a gate signal is applied to serially-connected N-channel MISFETs QN31, QN32 and QN33 in the N-channel logical block 122. Then, the series circuit is turned on, whereby the output signal Q8 is set to the reference voltage $V_{SS}$ or the level "0". The P-channel logical blocks 111 and 112 are turned on, because gate signal is supplied to any MISFET connected between the voltage $V_{DD}$ and any output wire other than the output wire 14h, to generate the output signal Q8. Therefore, other output signals Q1 through Q7 are set to the level "1". That is, the address decoder shown in FIG. 3 is a NAND circuit system.

Figure 4:
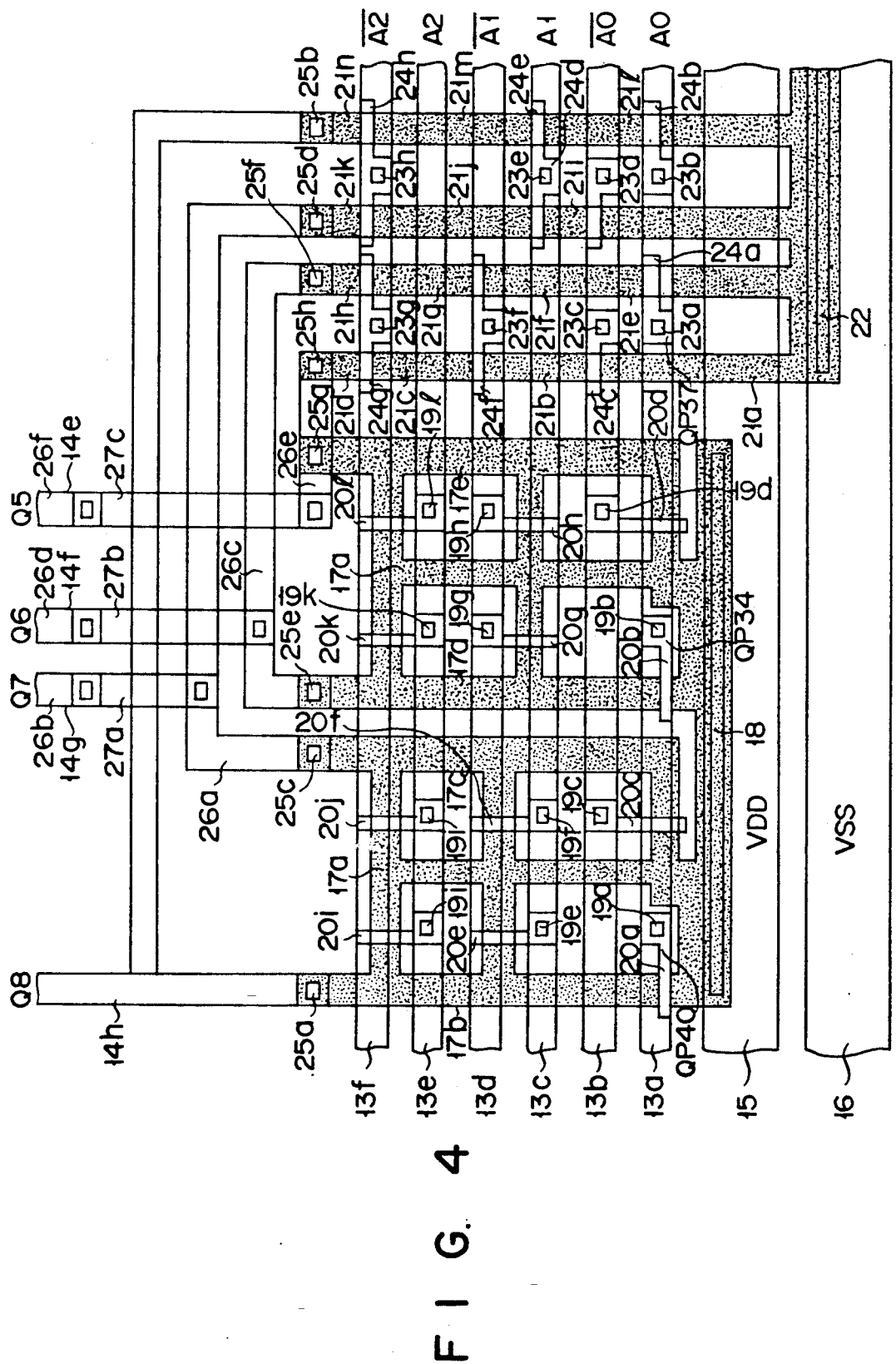
FIG. 4 shows the circuit pattern of a part of the circuit shown in FIG. 3.

FIG. 4 is a top view of the area enclosed by a one-dot chain line in FIG. 3 or the element structure of the P-channel logical block 112 and N-channel logical block 122 when the address decoder shown in FIG. 3 is actually integrated.

As is shown in FIG. 4, each of the input wires 13a to 13f is made of thin aluminum film extending in the second direction. Two power wires 15 and 16 are also made of thin aluminum film, to which the voltage $V_{DD}$ and the reference voltage $V_{SS}$ are applied both power wires 15 and 16 extend in parallel with the input wires 13a to 13f.

The P-type diffusion areas 17a to 17e serve as the source and drain areas of each P-channel MISFET and the P-type diffusion area 17a. They are connected to the power wire 15 by the contact portion 18. The input wire 13a is connected to the gate electrodes 20a and 20b, both made of polycrystal silicon, by through the contact portions 19a and 19b. The gate electrode 20a extends between the P-type diffusion areas 17a and 17b where the P-channel MISFET QP40 is formed. The gate electrode 20b is formed between the P-type diffusion areas 17a and 17b where the P-channel MISFET QP34 is formed.

Similarly, the input wire 13b is connected to the gate electrodes 20c and 20d, both made of polycrystal silicon, by the contact portions 19c and 19d. The input wire 13c is connected to the gate electrodes 20e and 20f made of polycrystal silicon by the contact portions 19e and 19f. The input wire 13d is connected to the gate electrodes 20g and 20h by the contact portions 19g and 19h. The input wire 13e is connected to the gate electrodes 20i and 20j by the contact portions 19i and 19j. The input wire 13e is connected to the gate electrodes 20k and 20l by the contact portions 19k and 19l. Each gate electrode extends between a corresponding pair of P-type diffusion areas, as is illustrated in FIG. 3.

The source and drain area of the N-channel MISFET are composed of N-channel diffusion areas 21a to 21n. The N-type diffusion area 21a is connected to the power wire 16 by the contact portion 22. The input wire 13a is connected to the gate electrodes 24a and 24b, made of polycrystal silicon, by the contact portions 23a and 23b. The gate electrode 24a extends between the N-type diffusion areas 21a and 21e, where the N-channel MISFET QN37 is formed. The gate electrode 24b is formed between the N-type diffusion areas 21a and 21l, where the N-channel MISFET QN31 is formed.

Similarly, the input wire 13b is connected to the gate electrodes 24c and 24d by the contact portions 23c and 23d. The input wire 13c is connected to the gate electrode 24e by the contact portion 23e. The input wire 13d is connected to the gate electrode 24f by the contact portion 23f. The input wire 13f is connected to the gate electrodes 24g and 24h by the contact portions 23g and 23h. Each gate electrode extends between a corresponding pair of N-type diffusion areas or two corresponding pairs of N-type diffusion areas, as is illustrated in FIG. 3.

The output wires 14a to 14e are aluminum wires. Alternatively, some of them are aluminum wire, and the others are polycrystal-silicon wires. The wire 14h is an aluminum wire, which is connected to the P-type diffusion area 17b and the N-type diffusion are 21n by the contact portions 25a and 25b. The output wire 14g is composed of aluminum wires 26a and 26b and a polycrystal silicon wire 27a. The aluminum wire 26a is connected to the P-type diffusion area 17c and the N-type diffusion area 21k by the contact portions 25c and 25d.

The output wire 14f is composed of aluminum wires 26c and 26d and a polycrystal silicon wire 27d connecting the wires 26c and 26d. The aluminum wire 26c is connected to the P-type diffusion area 17d and the N-type diffusion area 21h by the contact portions 25e and 25f.

The output wire 14e is composed of aluminum wires 26e and 26f and a polycrystal silicon wire 26c connecting the wires 26e and 26f. The aluminum wire 26e is connected to the P-type diffusion area 17e and the N-type diffusion area 21 by the contact portions 25g and 25h.

The input wires 13a to 13f for transferring address signals cross the first and second logical blocks composed of the P and N channels, respectively. Hence, it is not always necessary to adjacently arrange the serially-connected P-channel MISFETs QP1 and QP2, adjacent to and the parallely-connected N-channel MISFETs QN1 and QN2, unlike the conventional address decoder shown in FIG. 7. Therefore, the pattern layout is simple, and the chip can be small. Moreover, since output signals are output directly from the decode circuits, no jumper wires are necessary for logical blocks. As a result, the area occupied by each decode circuit is small.

Figure 5:
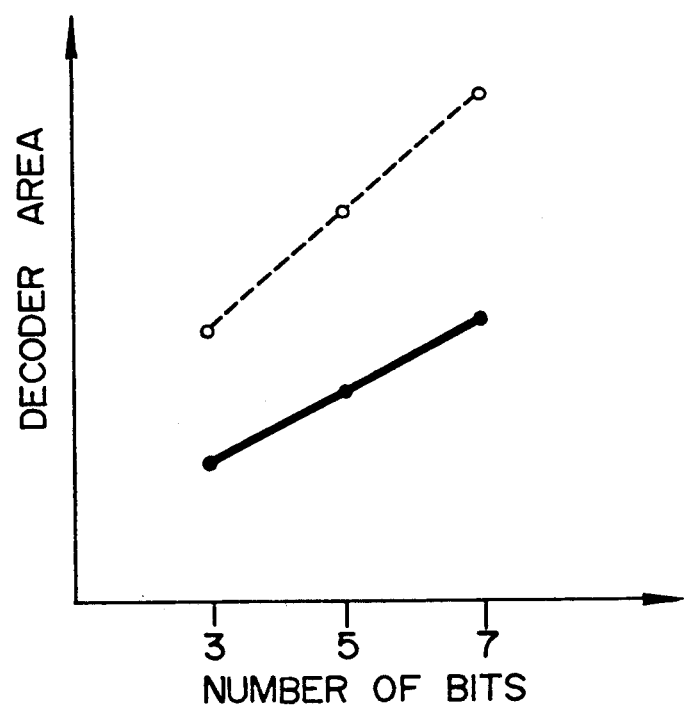
FIG. 5 shows the area required for a chip of the above embodiment, and also that required in the conventional decoder.

FIG. 5 shows the chip area of the conventional address decoder shown in FIGS. 6 and 7 and that of the address decoder of the present invention. More specifically, the curve A shows the chip area of the prior art, and the curve B shows that of the address decoder of the invention. The chip area of the decoder according to the present invention, shown by the curve B, is about half the chip area of the conventional decoder, shown by the curve A. This relationship revenues unchanged even if the number of address-signal bits is increased.

In the embodiment shown in FIG. 3, the address signals are three-bit ones. Nonetheless, according to the present invention, the number of bits forming an address signal can optionally be selected, as can understood from the decode circuit of FIG. 2 wherein two-bit address signals are used, and also from the circuit of FIG. 3, wherein three-bit address signals are cesed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An address decoder apparatus composed of CMOS, comprising:
   first logical block composed of first-channel-type MISFETs;
   second logical block composed of second-channel-type MISFETs and arranged adjacently in the second direction of said first logical block;
   input wires which are extendedly formed in the second direction parallel with the direction along which said first and second logical blocks are arranged so that the input wires will cross said first and second logical blocks and which connects with bit signals configuring address signal and sends gate signal to each gate of said first- and second-channel-type MISFETs configuring said first and second logical blocks respectively through said input wires in the first and second logical blocks; and
   an output circuit having output wires set in the first direction perpendicular to said second direction from said first and second logical blocks and connected in parallel.

2. An apparatus according to claim 1, wherein said first logical block is composed of P-channel MISFETs and said second logical block is composed of N-channel MISFETs.

3. An apparatus according to claim 1, wherein said first logical block has first MISFET circuits made by parallely connecting the first-channel-type MISFETs corresponding to the number of bits of said input address signal and each MISFET circuits are connected between a power source and said output wire.

4. An apparatus according to claim 1, wherein said second logical block has second MISFET circuits made by serially connecting the second-channel-type MISFETs corresponding to the number of bits of said input address signal and each MISFET circuits are connected between a power source and said output wire.

5. An apparatus according to claim 1, wherein said first logical block has first P-channel MISFET circuits made by parallely connecting the P-channel-type MISFETs corresponding to the number of bits of said input address signal, said second logical block has second N-channel MISFET circuits made by serially connecting the N-channel-type MISFETs corresponding to the number of bits of said input address signal, a set of local decode circuit is composed of a set of said first and second MISFET circuits, and each gate of P-channel MISFET configuring said first MISFET circuits of the local decode circuit and that of N-channel MISFET configuring said second MISFET circuit are arranged along said input wire extending in the second direction along which said first and second logical blocks are arranged.

6. An apparatus according to claim 5, wherein the simultaneously-connected source and drain of P-channel MISFETs connected in parallel and configuring set of MISFET circuits of said first logical block are formed along a wire extendedly formed in said first direction and the wire is connected to said output wire.

7. An apparatus according to claim 5, wherein N-channel MISFETs connected in series and configuring set of second MISFET circuits of said second logical block are connected to wires extendedly formed in said first direction and the wires are connected to said output wire.

8. An address decoder apparatus composed of CMOS, comprising:
  local decoding circuits each of which has a P-channel MISFET circuit composed of parallely-connected P-channel MISFETs corresponding to the number of bits of address signal and a N-channel MISFET circuit composed of serially-connected N-channel MISFETs corresponding to the number of bits of address signal and in which said P-channel and N-channel MISFETs are respectively correspondingly combined and each gate of the combined P-channel and N-channel MISFETs are arranged on a line extending in the second direction;
  input wires set by corresponding to each bits configuring address signal, which is extendedly set in said second direction and connected to said gate arranged on the line of said decode circuit;
  first output wires which are extendedly formed in the first direction perpendicular to said second direction and connects with source of the P-channel MISFETs configuring said P-channel MISFET circuits of said local decode circuits are connected in common;
  second output wires which are extendedly formed in said first direction and connects with either source of said P-channel MISFETs connected in series and configuring said N-channel MISFET circuits of said decode circuits; and
  output wires to which the first and second output wires extended from said local decoding circuits are connected in parallel.

* * * * *